United States Patent [19]

Strong

[11] Patent Number: 5,203,454

[45] Date of Patent: Apr. 20, 1993

[54] METHOD AND APPARATUS FOR TRANSPORTING SENSITIVE ELECTRONIC COMPONENTS

[76] Inventor: Leslie G. Strong, 240 Mississippi Dr., Monticello, Minn. 55362

[21] Appl. No.: 781,105

[22] Filed: Oct. 22, 1991

Related U.S. Application Data

[63] Continuation-in-part of Ser. No. 701,101, May 16, 1991, abandoned, which is a continuation-in-part of Ser. No. 603,456, Oct. 25, 1990, abandoned.

[51] Int. Cl.⁵ .............................................. B65D 73/02
[52] U.S. Cl. ................................... 206/328; 206/334; 206/560; 206/565; 220/307
[58] Field of Search ............... 206/328, 329, 331, 332, 206/334, 560, 564, 565; 220/307

[56] References Cited

U.S. PATENT DOCUMENTS

| | | |
|---|---|---|
| 1,101,315 | 6/1914 | Metzgar . |
| 1,169,845 | 2/1916 | McAllaster . |
| 1,261,937 | 4/1918 | Jambor . |
| 1,492,113 | 4/1924 | Welsh . |
| 1,817,913 | 8/1931 | Bellemere .......................... 206/560 |
| 3,102,728 | 9/1963 | Booth . |
| 3,892,309 | 7/1975 | Coffey et al. . |
| 4,083,453 | 4/1978 | Berger et al. . |
| 4,171,049 | 10/1979 | Nohara et al. ...................... 206/328 |
| 4,245,753 | 1/1981 | Ellis ................................. 220/307 X |
| 4,285,557 | 8/1981 | Paladino et al. . |
| 4,379,505 | 4/1983 | Alemanni . |
| 4,489,830 | 12/1984 | Charlebois et al. . |
| 4,535,887 | 8/1985 | Egawa . |
| 4,564,880 | 1/1986 | Christ et al. ..................... 706/334 X |
| 4,572,371 | 2/1986 | Asenbauer . |
| 4,615,441 | 10/1986 | Nakamura . |
| 4,681,221 | 7/1987 | Chickanushy et al. ............. 206/328 |
| 4,760,478 | 7/1988 | Pal et al. . |
| 4,853,811 | 8/1989 | Brooks, Jr. et al. . |
| 4,881,639 | 11/1989 | Matsuoka et al. . |
| 4,901,853 | 2/1990 | Maryatt . |
| 4,936,783 | 6/1990 | Petersen ........................ 206/331 X |
| 4,940,143 | 7/1990 | Stanfield . |
| 5,000,697 | 3/1991 | Murphy ......................... 206/329 X |
| 5,103,976 | 4/1992 | Murphy ............................. 206/328 |

FOREIGN PATENT DOCUMENTS 8800161  1/1988  PCT Int'l Appl. ................. 206/329

*Primary Examiner*—Bryon P. Gehman
*Attorney, Agent, or Firm*—Merchant, Gould, Smith, Edell, Welter & Schmidt

[57] ABSTRACT

A method and apparatus for packaging sensitive electronic components includes a tray having an outer wall with an inside surface which at least partially defines a protected space; releasable retention bars releasably retaining the components in the protected space. The tray and retention bar are preferably fabricated from an electrically conductive material, so that the assembly may be grounded during transport and handling. The method of packaging and transporting includes providing the container, placing at least one component in the protected space, placing the retention bar over the component to retain it in the protected space, engaging the ends of the bars with the container to capture the component between the bar and the inside surface of the tray, and transporting the tray with captured components to a desired location, during which time the assembly is protected against damage during handling.

20 Claims, 9 Drawing Sheets

METHOD AND APPARATUS FOR TRANSPORTING SENSITIVE ELECTRONIC COMPONENTS

This application is a continuation-in-part of United States patent application Ser. No. 07/701,101, filed on May 16, 1991 now abandoned which is a continuation-in-part of United States patent application Ser. No. 07/603,456, filed on Oct. 25, 1990 now abandoned which are hereby incorporated by reference.

BACKGROUND OF THE INVENTION

1. Field of the Invention

This invention relates generally to the field of packaging and transporting sensitive electronic components including spring-loaded suspension assemblies with or without additional components such as test boards or electronic sensors/transducers, test boards alone or other components. More particularly, the invention relates to improved containers for packaging these sensitive electronic components during transport and handling, whether in manual or automated systems.

2. Description of the Prior Art

A variety of devices have been designed to hold and protect sensitive electronic components during transport and handling. Many of these devices are not, however, adapted for use in modern automated handling systems.

A disadvantage of prior art containers is that many are typically capable of holding components of only one size, necessitating the use of different containers for different components.

The sensitivity of the components has, in the past, added to the handling and transport costs. This has been exacerbated in situations where it is necessary to transfer the components from one station to another, such as during cleaning, testing and other processing. In particular, the components must usually be removed from the prior art containers to clean them, significantly increasing the cost of cleaning.

Particular problems are associated with the transport and handling of magnetic transducer heads and their suspension assemblies. The transducer heads are used for loading and retrieving electronic data off storage media, such as the hard disks which are found in personal computers. Transducer heads are commonly supported during operation by a suspension assembly which includes a gimble spring or load beam for mounting the transducer head relative to a mounting plate of the assembly. During assembly, the gimble spring is precisely loaded to a predetermined deflection, in a procedure which is commonly known as gram-loading. Upon assembly of the suspension assembly and head into a disk drive, the proper deflection will ensure that the head is spaced a precise, predetermined distance from the magnetic disk.

If the deflection is disturbed during transport of the suspension assembly from its point of manufacture to assembly into a disk drive, the spacing will be disturbed, and the disk drive itself may be rendered inoperable. It is also important to prevent exposure of the assembly and head to contaminants during transport and processing. Consequently, suspension assemblies must be treated with extreme care during their transport and handling.

Additional difficulties have been encountered when transporting suspension assemblies which may or may not have extremely fine wire leads attached to them, and the leads, in turn, may or may not have test boards attached to their opposite ends. In addition to the difficulties associated with transporting the suspension assemblies without disturbing their preset deflection, the attached wire leads and, possibly, test boards also must be transported without detaching them from the electronic sensors/transducers to which they are attached. In addition, unsecured test boards or wire leads can damage or contaminate the sensors/transducers.

It is clear that there has existed a long and unfilled need in the art for an improved method and apparatus for packaging sensitive electronic components during transport and handling in manual or automated systems.

SUMMARY OF THE INVENTION

Accordingly, it is an object of the invention to provide an improved method and apparatus for packaging sensitive electronic components during transport and handling, whether in manual or automated systems.

It is further an object of the invention to provide a container which will minimize the possibility of contamination and of electronic damage resulting from a build up of static electricity.

It is yet further an object of the invention to provide a container which may be adapted for use as a module to transport sensitive electronic components from station to station during processing steps such as cleaning, testing and other processing.

It is another object of the invention to provide a container for holding sensitive electronic components which may be of the same or different sizes while allowing the components to be cleaned without removing them from the container.

In order to achieve these and other objects of the invention, a container for packaging sensitive electronic components during transport according to a first aspect of the invention includes a tray having an outer wall with an inside space which at least partially defines a protected space; and releasable retention bars which cooperate with the tray to retain components in the protected space, whereby the components are protected against damage during transporting and handling. The container can also include mounting means in the protected space for mounting the components and restraining them from lateral motion within the protected space. The mounting means can include recesses formed in the inside surface of the tray, protrusions formed on the inside surface, or a combination of recesses and protrusions.

Voids can also be provided in the walls and/or bottom of the tray to allow visual inspection, further processing and cleaning of the components without requiring removal from the tray.

The preferred embodiment of the trays is manufactured from electrically conductive materials, ideally a moldable plastic. The trays are also preferably stackable for ease in transport and handling.

According to a second aspect of the invention, a method of packaging and transporting sensitive electronic components includes the steps of (a) providing a container comprising a tray having an outer wall with an inside surface which at least partially defines a protected space therein and at least one retention bar having two ends adapted to cooperate with said inside surface such that said bar and tray cooperate to retain at least one component in said protected space; (b) placing at least one component in said protected.space; (c) placing said retention bars in said protected space; (d) engaging the ends of said bars so as to capture the component between at least one of said bars and inside surface of said tray; and (e) transporting the tray with captured components to a desired location, during which time the assembly is protected against damage during handling.

Additional methods can include cleaning of the components while they are held in the tray, as well as the attachment of electronic sensors/transducers to suspension assemblies held in the container. Yet additional methods include the bonding of wires to test boards or other accessories held in the container as well as to electronic sensors/transducers located on the suspension assemblies.

These and various other advantages and features of novelty which characterize the invention are pointed out with particularity in the claims annexed hereto and forming a part hereof. However, for a better understanding of the invention, its advantages, and the objects obtained by its use, reference should be made to the drawings which form a further part hereof, and to the accompanying descriptive matter, in which there is illustrated and described a preferred embodiment of the invention.

DETAILED DESCRIPTION OF THE PREFERRED EMBODIMENT(S)

Figure 1:
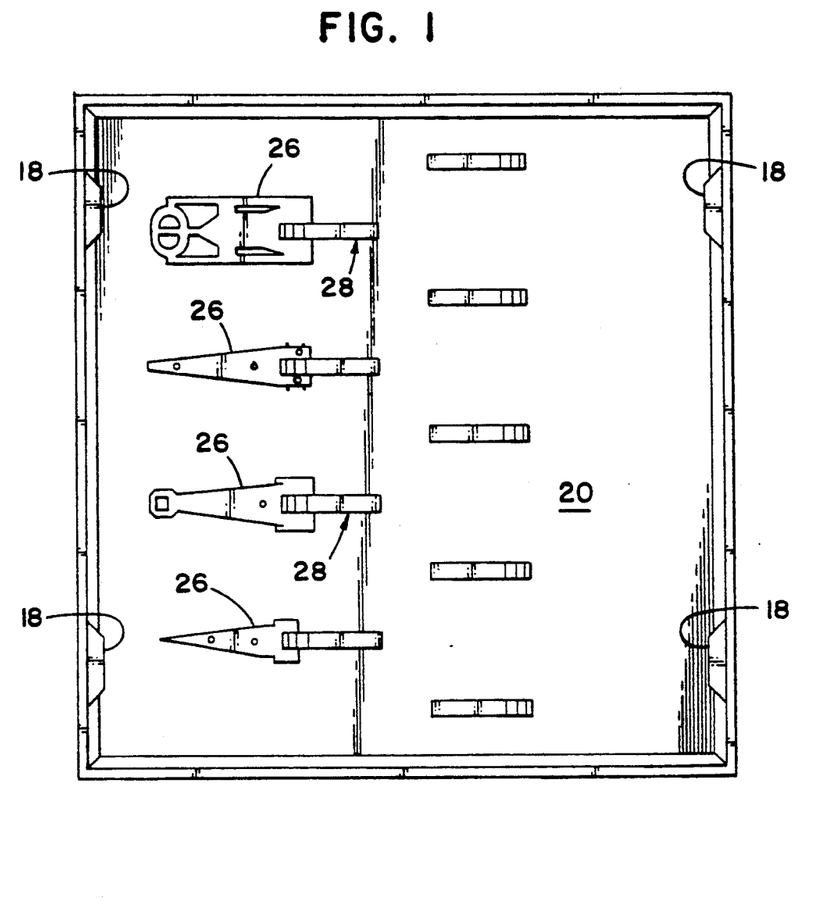
FIG. 1 is a top plan view of a container constructed according to a preferred embodiment of the invention.
Figure 2:
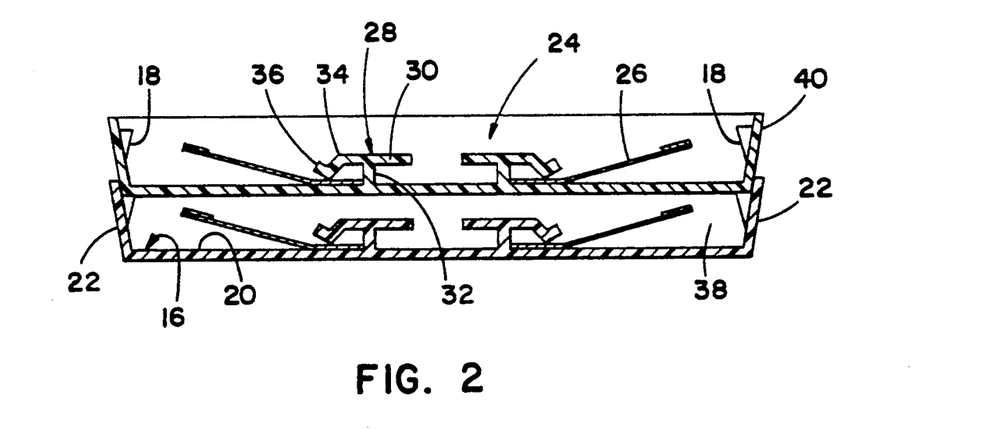
FIG. 2 is a diagrammatic cross-sectional view of two containers constructed according to the embodiment of FIG. 1, shown in a stacked arrangement.

Referring now to the drawings, wherein like reference numerals designate corresponding structure throughout the views, a container 10 constructed according to a preferred embodiment of the invention includes a tray 12 having an outer wall 14 with an inside surface 16 which at least partially defines a protected space 38 above inside surface 16. As may best be seen in FIG. 2, outer wall 14 is preferably constructed of a bottom wall portion 20 and of four side walls 22, which together with bottom wall portion 20 form a box-like structure that is open at the top. As can further be seen in FIG. 2, side walls 22 preferably flare outwardly and upwardly so as to permit the container 10 to be stacked along with like containers. For example, as is shown in FIG. 2, a second container 40 is shown stacked with respect to container 10. To further facilitate stacking, a plurality of molded inserts 18, which have relatively flat upper surfaces, are provided at upper inside portions on at least two of the side walls 22. As may be seen from FIG. 2, the inserts 18 support the lower, outer peripheral surface of the bottom wall portion 20 on the adjacent second container 40.

Referring again to FIGS. 1 and 2, releasable gripping structure 24 is provided, integrally with the inside surface 16 of tray 12, for releasably gripping a mounting plate portion 42 of a sensitive, spring-loaded suspension assembly 26, such as a head gimble assembly. In the preferred embodiment, releasable gripping structure 24 includes two adjacent, parallel rows of clamping members 28. Clamping members 28 are preferably molded unitarily with tray 12, and each include a lever arm 30 which is substantially aligned and coextensive with a gripper arm 34 having a depending gripping flange 36 molded thereto. Lever arm 30 and gripper arm 34 are attached to the inside surface 16 of bottom wall portion 20 by a fulcrum web 32, as may be seen in FIG. 2.

Preferably, the entire container 10, including tray 12 and the gripping structure 24 is simultaneously formed in one piece by injection molding or an equivalent forming process. It will be understood, however, that the tray could be of a modular construction which could be assembled to form the container of the present invention.

Preferably, container 10 is fabricated from an electrically conductive material, so that the suspension assembly 26 may be grounded during transport and handling. Most preferably, container 10 is fabricated from an electrically conductive plastic compound, many of which are commercially available. For example, the plastic compound might have a polyolefin base with carbon or steel fibers or powders impregnated therein.

Alternatively, container 10 could be fabricated from an electrically conductive ferrous or non-ferrous metal. In this embodiment, container 10 could be formed through a stamping process, and clamping members 28 could be sufficiently rigid to enable container 10 to serve as a "fixture container" for holding portions of a head suspension assembly during its assembly.

Container 10 could also be fabricated from a non-conductive material such as a non-conductive thermosetting or thermoplastic polymer. Yet another embodiment could include a container 10 which is manufactured of more than one material, such that a portion of the tray, such as inside surface 16, is conductive, with the remainder of the container 10 being formed of non-conductive materials.

Figure 3:
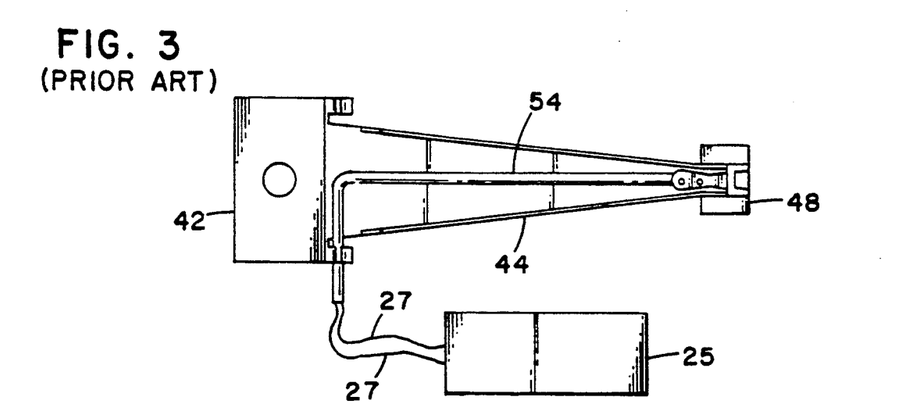
FIG. 3 is a top plan view of a typical head suspension assembly, which is old and well-known in the art.
Figure 4:
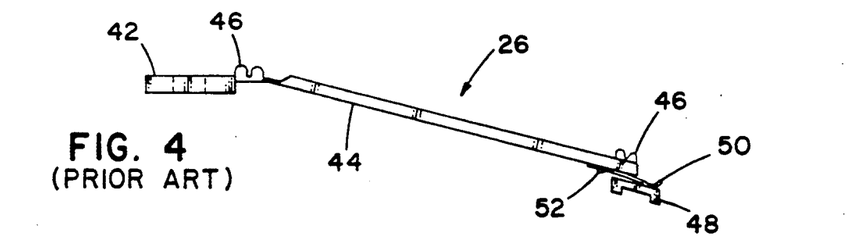
FIG. 4 is a side elevational view of the head suspension assembly shown in FIG. 3.

Referring now to FIGS. 3 and 4, a typical head suspension assembly 26 includes a relatively sturdy mounting plate 42 which supports a magnetic recording head 48 via a rail 44, and a gimble spring 50. Also shown is a test board 25 connected to the head 48 via wire lead 54. Gimble spring 50 is connected to rail 44 by what is known as a T-flex 52. A wire lead 54 extends along rail 44 to a connection with a pair of pickle forks 46. As may be seen in FIGS. 3 and 4, mounting plate 42 may have one or more mounting holes defined therein. Examples of typical head suspension assemblies are disclosed in U.S. Pat. Nos. 4,760,478 and 4,853,811, which are hereby incorporated by reference.

Figure 5:
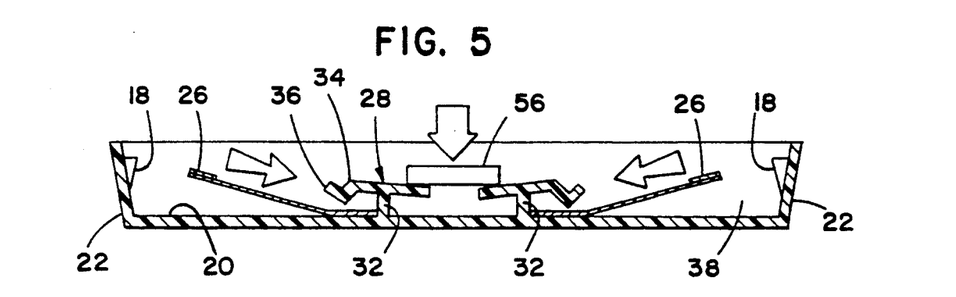
FIG. 5 depicts a container according to the embodiment of FIGS. 1 and 2 in a first operative position.
Figure 6:
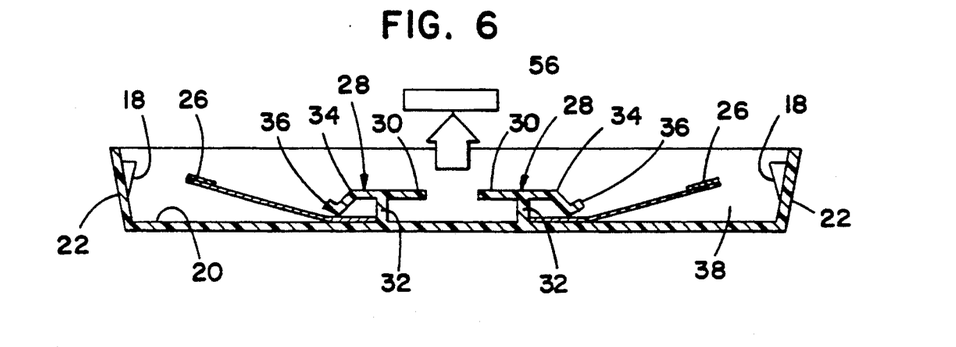
FIG. 6 shows a container constructed according to the embodiment of FIGS. 1 and 2 in a second operative position.

In practice, gimble spring 50 is loaded to a predetermined deflection at the time suspension assembly 26 is manufactured, through a process which is commonly known as "gram loading". In order to protect unit 26 against deflection or other damage during transport and handling, an operator depresses the lever arm 30 of one or more of the clamping members 28, thus unclamping or releasing depending flange 36 from the inside surface 16 of the bottom wall portion 20 in tray 12. This step is illustrated in FIG. 5 of the drawings. FIG. 5 schematically illustrates this step. As is shown in FIG. 5, the lever arms 30 of several aligned clamping members 28 can be simultaneously depressed by an actuating member 56, which can be an elongate bar having a rectangular cross-section. This makes the container 10 specifically adapted for use with robotic handling systems. Next, the suspension assembly 26 is positioned with its mounting plate 42 between the depending flange 36 and the upper inside surface 16 of bottom wall portion 20. Suspension assembly 26 should be positioned so that its head end, which includes recording head 48 and gimble spring 50, extends into the protected space 38 that is defined by the outer wall 14 of tray 12. Once suspension assembly 26 is properly positioned, the operator releases pressure on lever arm 30, thus allowing the natural resiliency of clamping member 28 to re-bias depending flange 36 downwardly toward the inside surface 16 of bottom wall portion 20. This step is illustrated in FIG. 6 of the drawings. This step is schematically illustrated in FIG. 5B. This effectively engages the gripping structure 24 to securely clamp the mounting plate 42 of suspension assembly 26. At this point in time, the tray and captured suspension assemblies 26 may be transported to a desired location without fear of the suspension assemblies 26 being damaged by deflection or other unwanted contact during transport and handling.

Another possible use for container 10 is as a module for transporting the suspension assemblies 26 during manufacturing processes such as cleaning and testing. For example, upon arrival at the assembling facility of the disk drive original equipment manufacturer, the suspension assemblies 26 may be transported while still in container 10 to a station for cleaning. Container 10 may then be robotically or manually transported to a testing station, then finally to an assembly station for assembling the units 26 into a disk drive unit.

Additional features of the various preferred embodiments of the present invention are depicted in FIGS. 7-13. Features disclosed therein are described in greater detail below.

Figure 7:
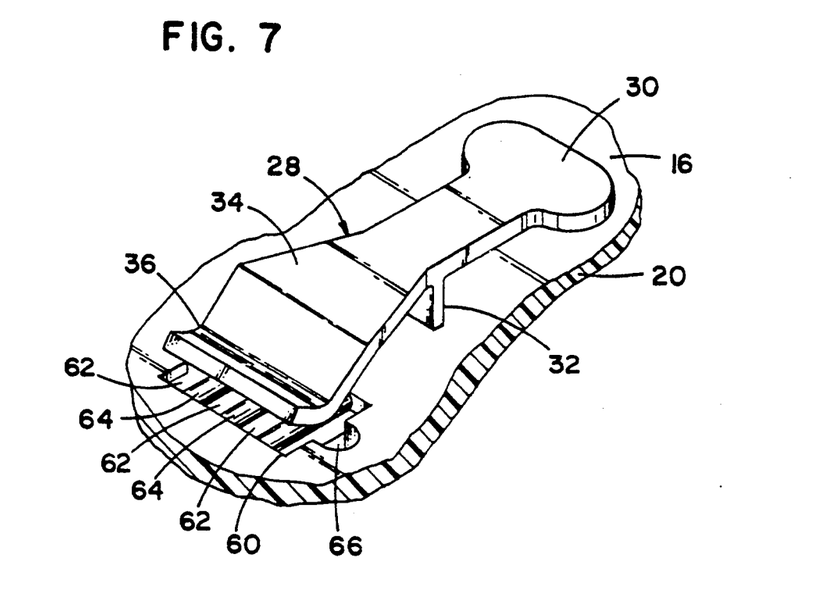
FIG. 7 shows an enlarged view of a clamping member with a slotted gripping area.

In FIG. 7, an alternate embodiment of a clamping member 28 is shown in an enlarged view. Clamping member 28 has a gripping flange 36 which contacts a gripping area 60 located on the inner surface 16 of the bottom wall 20. In the embodiment shown in FIG. 7, gripping area 60 contains a series of cavities 62 formed in bottom wall 20. Cavities 62 are preferably in the shape of slots while slats 64 have upper surfaces which are essentially planar with inner surface 16 of bottom wall 20. Cavities 62 can be formed through the bottom wall 20 or be formed only partially through the bottom wall, as desired by the user. Slats 64 can have any cross-section shape with the preferred being substantially semi-circular. The cavity 62 and slats 64 alternate across the gripping area 60.

The preferred gripping area 60 also includes apertures 66 (only one of which is shown) on each end of gripping area 60. Aperture 66 can be used to provide clearance for protrusions on the mounting plates of spring loaded assemblies placed under clamp 28, such as pickle forks 46 depicted in FIG. 4, as well as providing access for tools to lift the assemblies 26 out of the tray. Pairs of the apertures 66 can be seen in FIGS. 9-11.

Figure 8:
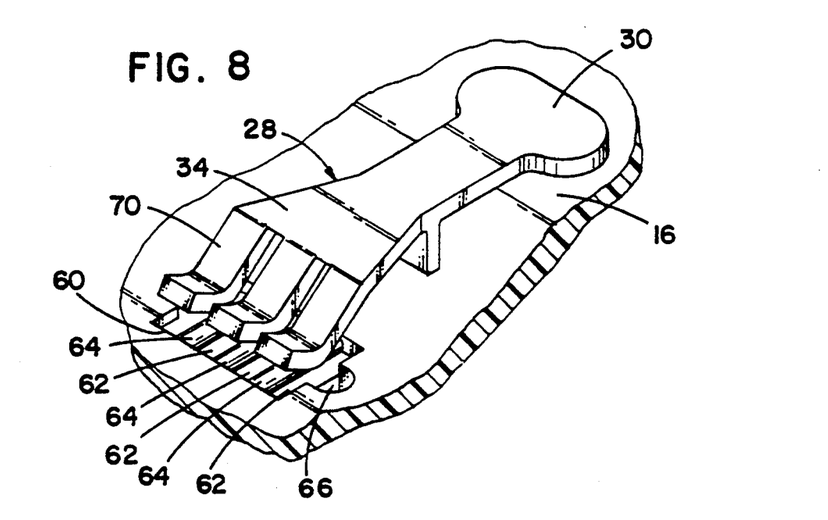
FIG. 8 depicts an enlarged view of an alternate clamping member having fingers meshing with the slotted gripping area.

An additional alternate embodiment of clamping member 28 is shown in FIG. 8. As shown there, the clamping member 28 is comprised of a lever arm 30, a gripping arm 34 and a series of fingers 70 which are adapted to hold the mounting plate of a spring loaded assembly against inner wall 16 of the tray. As shown in FIG. 8, the slats 64 and cavity 62 of the embodiment depicted and described regarding FIG. 7 are adapted to mesh with fingers 70 of clamping member 28. By allowing fingers 70 to mesh with bonding area 60, the fingers 70 can extend below the plane of inner surface 16. Such a construction is advantageous in that it simplifies construction of the tray and clamping members 28 by allowing the tray and clamping members to be molded in one-piece while still allowing clamping member 28 to be biased with fingers 70 in the downward position to provide sufficient force to contain a mounting plate 42 against inner surface 16. When a mounting plate is not present, the fingers 70 extend below the plane formed by the inner surface 16 of the tray.

Also shown in FIG. 8 is an aperture 66 which is one of a pair of apertures located on opposite sides of the bonding area 60 to allow access for tools to remove the assemblies as well as to allow protrusion of any extensions of the mounting plate into the bottom wall 20 of the tray, thus allowing a more secure attachment of the assemblies underneath clamping members 28.

Figure 9:
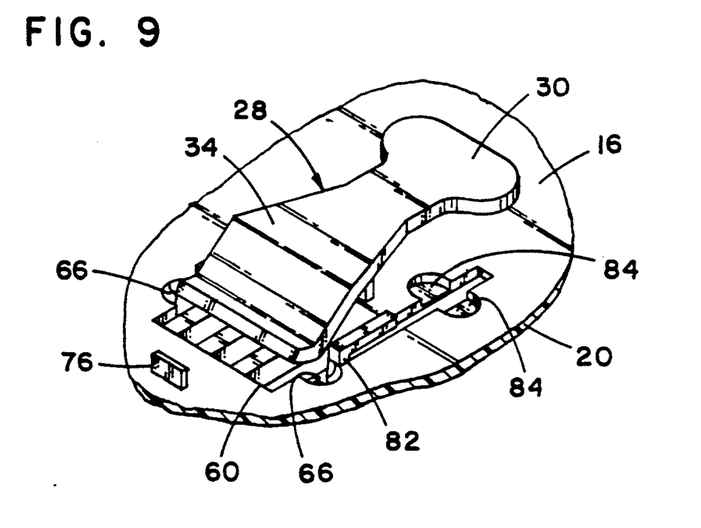
FIG. 9 depicts an enlarged view of an alternate clamping member with an accessory slot.

FIG. 9 depicts additional features of alternate embodiments of the present invention. More specifically, FIG. 9 depicts an accessory slot 80 located proximate clamping member 28. Slot 80 includes a retaining member 82 in the form of a clip which is integral with the bottom wall 20 of the tray. Accessory slot 80 also includes apertures 84 disposed on either side to allow access to remove an item placed in accessory slot 80. Accessory slot 80 can be formed as either a slot formed through the bottom wall 20 or, in the alternative, slot 80 can be formed as a cavity in bottom wall 20 which does not protrude through that wall. It will be appreciated that slot 80 could have any preferred length as desired for processing.

In use, an operator would slide a test board (not shown) under retaining member 82 into slot 80 to be retained therein by that member 82. The board could be removed by lifting it out of slot 80 using apertures 84 for increased access. Additional methods of use include the bonding of the wire leads 54 to either or both the test boards 25 and any electronic unit 48 attached to the suspension assembly 26. It will also be appreciated that the unit 48 could also be attached to suspension assembly 26 while it is held in container 10.

An additional feature also depicted in FIG. 9 is the use of a support member 76 in front of the clamping member 28. Support member 76 to supports the suspension assembly after clamping member 28 has been released from contact with its mounting plate. The use of support member 76 protects any electronic transducer or other delicate electronic equipment located on the suspension assembly from damage due to contact with the tray after clamping member 28 has been released.

Figure 10:
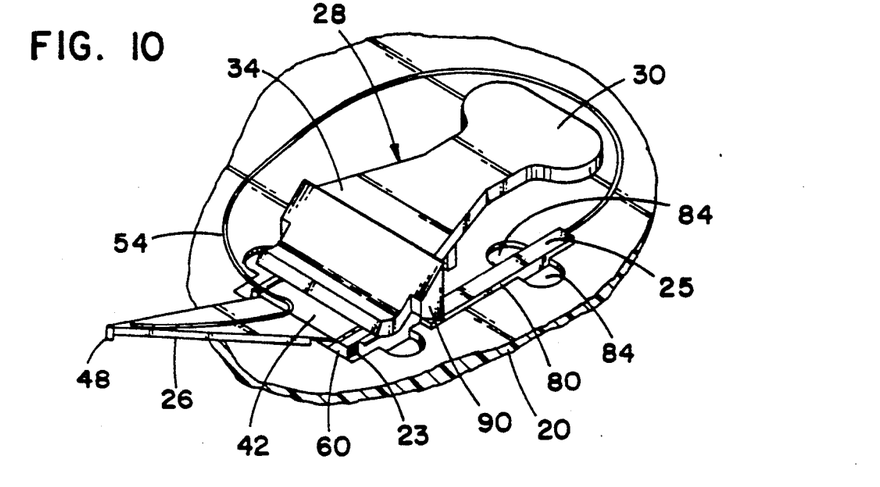
FIG. 10 depicts an enlarged view of a clamping member holding a suspension assembly to which a test board is attached using a wire lead.

FIG. 10 depicts a clamping member 28 with a suspension assembly 26 clamped in place. Suspension assembly 26 includes wire lead 54 attached to test board 25. Test board 25 is located in accessory slot 80. The test board 25 is retained in slot 80 by the use of retaining means 90 which is an alternate embodiment of retaining means 82 depicted in FIG. 9. As can be seen in FIG. 10, retaining means 90 will release test board 25 when lever arm 30 of clamping assembly 28 is depressed. As a result, test board 25 can be removed and inserted into slot 80 at the same time that suspension assembly 26 is being removed or placed on mounting area 66.

Also shown in FIG. 10 is pickle fork 46 which is a part of the mounting plate of suspension assembly 26. As shown there, pickle fork 46 protrudes downwardly from the mounting plate. It is for such features that the slotted mounting area 66 is provided because the mounting plate 42 can then be held flush with the inner surface 16 of the container.

Figure 11:
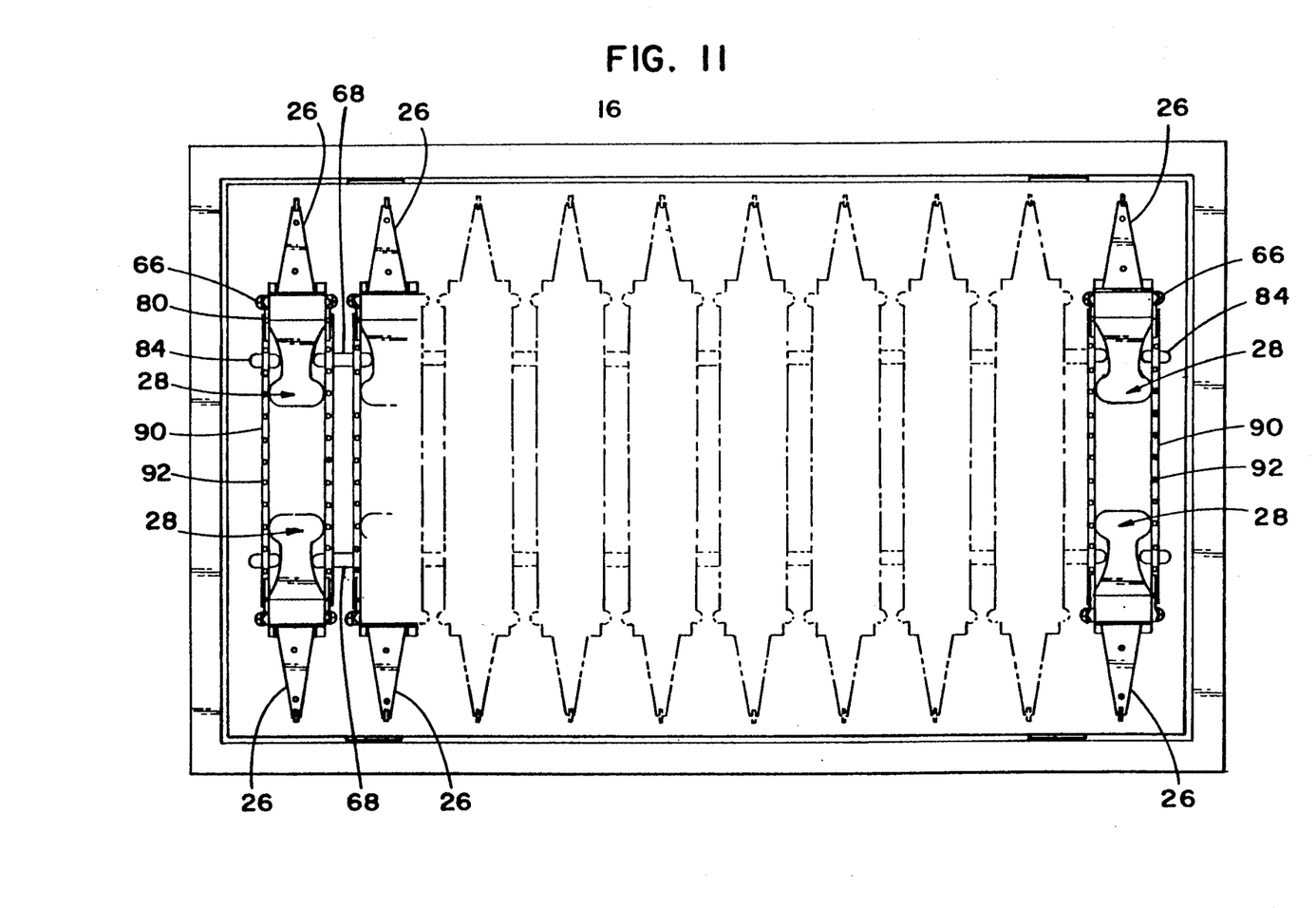
FIG. 11 is a top view of an alternate preferred embodiment of the container of the present invention including accessory slots and channels to hold test boards and their attached wires.

FIG. 11 is a top view of an additional alternate embodiment of the container of the present invention. As depicted there, the container has a series of clamping members 28 which are depicted as clamping suspension assemblies 26 in the container. An additional feature disclosed in this figure is the use of channels 90 located proximate both sides of the clamping members 28 and connecting slots 80 of opposite clamping members. Channel 90 and slots 80 are provided with apertures 92 which are preferably small holes formed through the bottom wall 30 of the container. These holes 92 are used as drain holes for cleaning fluids as well as vacuum holes when the tray is used on a vacuum plate.

Figure 12:
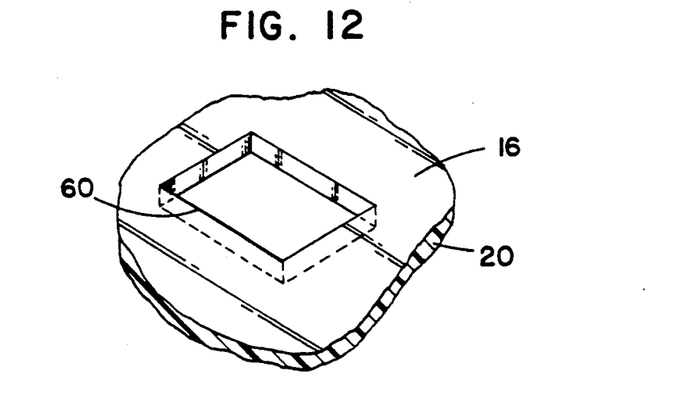
FIG. 12 is a view of a recessed gripping area minus surrounding structure.
Figure 13:
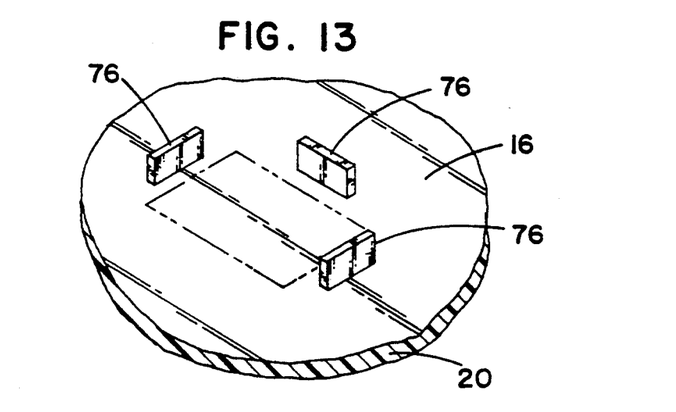
FIG. 13 is a view of a gripping area surrounded by containment means for containing the mounting plate of a suspension assembly.

Also useful in conjunction with the vacuum plate, are cavities 62 which can be formed through the bottom wall 20 and/or holes 94 (shown in FIGS. 12 & 13). In that case, the vacuum can be used to align and hold the mounting plates 42 of suspension assemblies 26 in place when clamping member 28 is opened.

This vacuum feature of the container is especially helpful when suspension assemblies 26 are provided with test boards having wire leads. The wire leads and test boards can be placed in the channels and held there by the use of vacuum provided through the holes 92. Alternate methods of using the channels 90 and test boards slots 80 include the use of the test board slots next to each clamping member or, in the alternative, using the accessory slots and channels across the tray from the clamping member 28. Such a method of use is particularly advantageous when test boards are provided with long leads which are difficult to loop around clamping member 28 or which may become tangled with the leads of other test boards.

Also depicted in FIG. 11 is the use of a slot 68 between accessory slot 80 to provide access to items located in accessory slot 80. The use of a slot between accessory slots 80, rather than an aperture as described for the previous embodiments, is primarily to reduce the cost and complexity of producing the container. In cross section, the channel 90 is preferably formed in a substantially V-shaped groove although a channel of any suitable cross-section can be used.

It will be understood by those skilled in the art that although 20 clamping members have been depicted in FIG. 11, any number of clamping members could be used in a container, the total number being dependent only on the needs of the user. Clamping members 28 may be aligned back to back as shown in FIG. 11, or offset with one another as shown in FIG. 1. Other considerations in designing the layout and placement of clamping members 28 is the adaptability of such a design for automation. In particular, any design should have symmetry in that it can be rotated 180° without altering the automation process. It will also be appreciated that any number of rows, including a single row, of clamping members 28 could be used in a container rather than two aligned rows as depicted in FIGS. 1 and 11.

FIGS. 12 and 13 depict additional alternate embodiments of the gripping area, the embodiments are depicted without clamping members 28 or other structure to enhance their clarity. FIG. 12 shows a recessed gripping area 60 which is sized to receive the mounting plate of a suspension assembly. With the mounting plate held in such a recessed area, it can be contained more securely under a clamping member 28. An alternate embodiment is depicted in FIG. 13, which shows a plurality of raised portions 96 surrounding the gripping area 60. Like the recessed gripping area depicted in FIG. 12, the raised portions 96 cooperate to contain mounting plates under clamping members 28. It will be understood that the raised portion could consist of a single raised portion, or any number of distinct raised portions.

FIGS. 12 & 13 also show holes 94 which are formed through the bottom wall 20 for use in draining of cleaning fluids and in positioning of assemblies with vacuum provided by a vacuum plate. It should be understood that the features depicted in FIGS. 12 and 13 can be incorporated together or separately into any of the above described embodiments.

ADDITIONAL PREFERRED EMBODIMENTS

Figure 14:
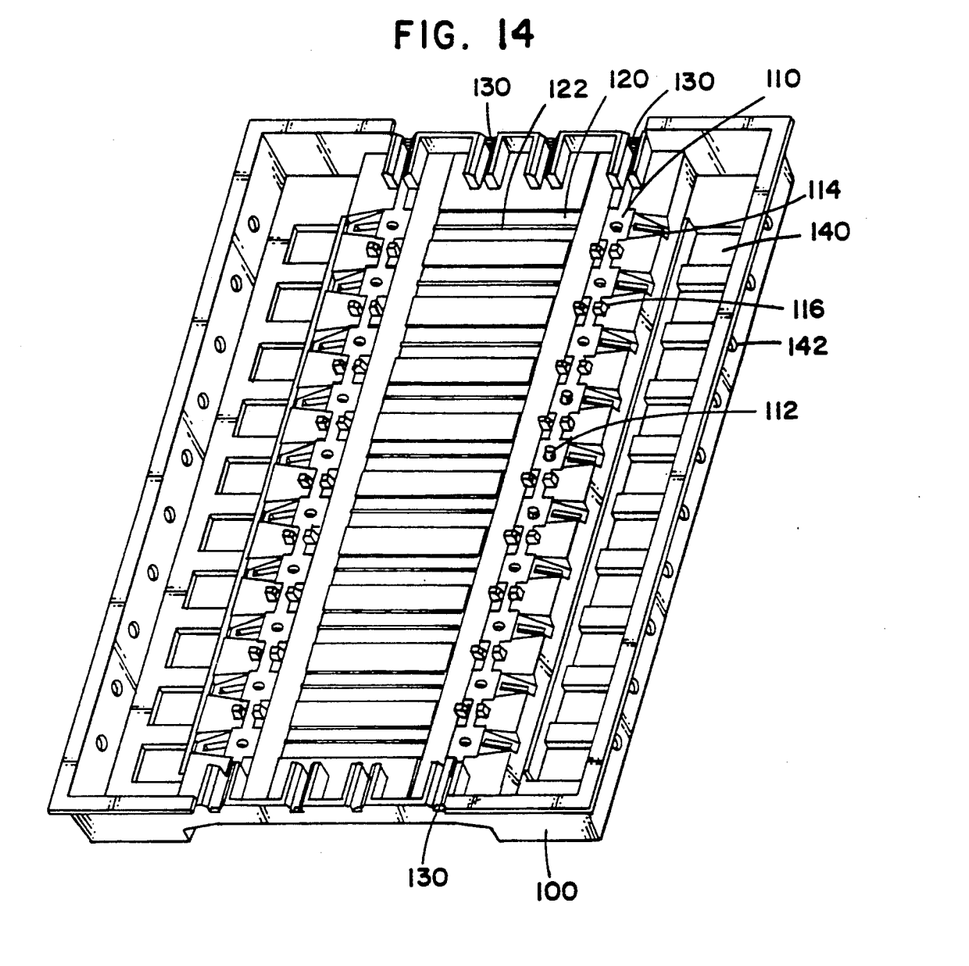
FIG. 14 is a perspective view of an alternate embodiment of the present invention.

An additional preferred embodiment of the present invention adapted specifically for transporting suspension assemblies with or without attached test boards is depicted in FIG. 14. Tray 100 is shown with a plurality of mounting positions formed therein adapted to hold suspension assemblies as described above. The tray 100 contains two rows of oppositely facing areas 110 for mounting suspension assemblies. In between the two rows are slots 120 adapted to hold test boards connected to the suspension assemblies. It will be understood that any number of rows could be contained in a given tray, with the preferred number depicted as two.

The suspension assemblies are mounted in tray 100 with their mounting plate portions resting in areas 110 located in the tray. Areas 110 are preferably slightly recessed with respect to the surrounding area to provide additional control over the suspension assemblies. Alternately, it will be understood that area 110 could be surrounded with protrusions to accomplish the same effect.

Contrary to the orientation described in the embodiments above, the suspension assemblies are mounted in tray 100 with their arm portions resting in a downward direction, i.e., at an angle below the plane of the mounting plate which rests in area 110. To accommodate the arms, a portion 114 of the tray is formed at a sufficient angle downward from the mounting plate area 110 to allow the suspension assemblies to rest in tray 100 without deflecting the arms from their desired angle relative to the mounting plates. As such, area 114 is preferably formed at a sufficient downward angle to accommodate any suspension assembly the user wishes to mount in the tray 100 without deflection. Those assemblies which have lesser deflection rest in tray 100 with their arms suspended above area 114.

Also located between mounting plate areas 110 are protrusions 116 which aid in aligning retaining bars which stretch between areas 130 in tray 100. The retaining bars are described in greater detail below. For present purposes, however, protrusions 116 are provided to prevent horizontal deflection of the bars when they are mounted in tray 100. Alternately, each mounting plate area 110 can be provided with a post 112 adapted to pass through an aperture formed in standard mounting plate portions of suspension assemblies. The post 112 aids in aligning the mounting plates in tray 100 while loading and also serves to prevent lateral deflection of any bar placed across the mounting plates to retain them in tray 100. As such, protrusions 116 can be eliminated if alignment posts 112 are included in tray 100. If, however, the user desires so, both protrusions 116 and alignment posts 112 can be used in a tray 100 to provide additional control over the bars.

Also included in tray 100 are inspection areas 140 and 142 which are essentially voids in the bottom wall and side walls, respectively, of the tray 100. These areas allow for visual inspection of any magnetic heads mounted on the suspension assemblies without removing the assemblies from tray 100. Areas 140 and 142 also allow for cleaning of the suspension assemblies while retained in tray 100.

Also contained in tray 100 are slots 120 separated by ribs 122 which are adapted to receive test boards which may be attached to the suspension assemblies retained in tray 100. The slots are preferably formed with sufficient depth to prevent lateral movement of the test boards when a retaining bar is placed over them between corresponding areas 130 in tray 100.

Figure 15:
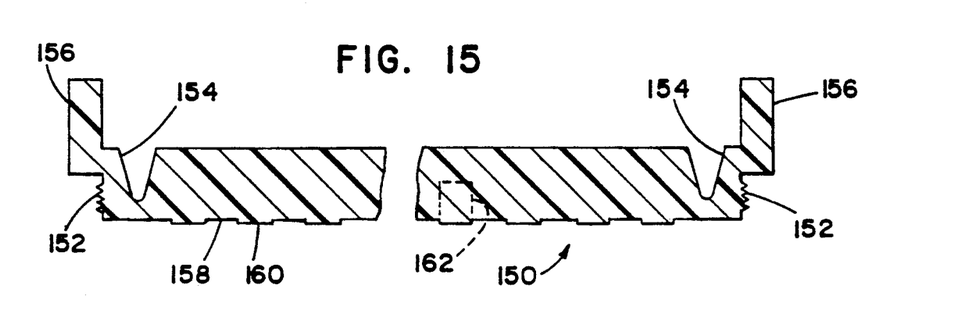
FIG. 15 is a side view, taken in partial cross-section, of a clamping bar adapted for use in the tray of FIG. 14.

FIG. 15 illustrates one preferred embodiment of the bars used in connection with the tray 100 of FIG. 14. The bars are preferably constructed to allow them to be used to retain either mounting plates of suspension assemblies or test boards, although it will be understood that special bars may be used to accomplish each of these tasks.

As shown in FIG. 15, bar 150 includes serrated areas 152 on each end which are adapted to cooperate with corresponding serrated areas 130 and tray 100 (see FIG. 14). Arms 156 and slots 154 on each end of mounting bar 150 allow for serrated areas 152 to be squeezed together to allow insertion of bar 150 into tray 100. Other features of bar 150 include portions 160 along the bottom edge of bar 150 which are adapted to retain mounting plates in areas 110 and test boards in slots 120 in tray 100. Raised areas 158 in the bottom of bar 150 are provided to allow passage of any wires which attach the test boards to the suspension assemblies mounted in tray 100. Alternately, bar 150 can have a bottom surface coated with a suitable foam or other compressible material to provide adequate retention of the components under the bar without damaging them.

Also depicted in FIG. 15 are relief areas 162 which are adapted to receive any alignment posts 112 which may be formed in the tray 100 as described above. Relief areas 162 are preferably bores formed in bar 150 which have sufficient depth and diameter to accommodate posts 112 shown in FIG. 14.

Figure 16:
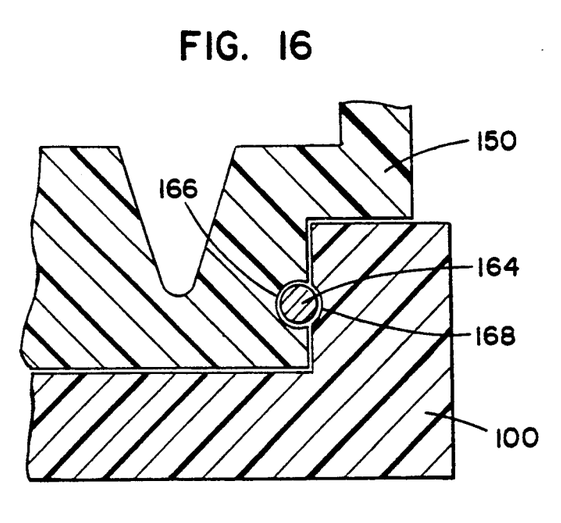
FIG. 16 is a cross-section of an alternate retention system for retaining the bar of FIG. 15 in the tray of FIG. 14.
Figure 17:
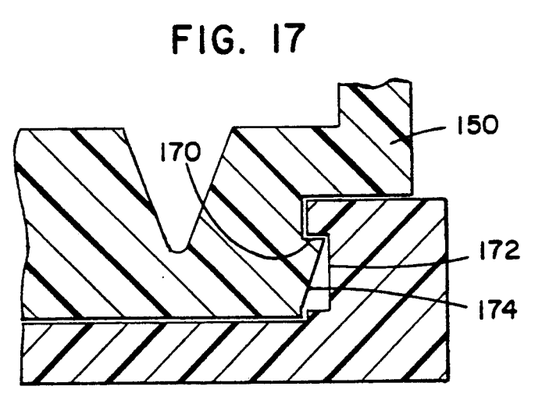
FIG. 17 is a cross-section of an alternate retention system for retaining the bar of FIG. 15 in the tray of FIG. 14.

FIGS. 16 and 17 depict alternate embodiments of retention means adapted to retain bars 150 in tray 100. In FIG. 16, a ball and socket arrangement is used in which ball 164 in socket 166 is adapted to cooperate with detent 168 formed in the side wall of tray 100. It will be understood that detent 168 is formed in tray 100 in place of serrations 130 as depicted in FIG. 14.

FIG. 17 depicts a latching arrangement in which step 170 is formed in bar 150 which cooperates with slot 172 formed in place of the serrations depicted in as area 130 in tray 100 in FIG. 14. Face 174 leading up to step 170 is preferably angled outward from the bottom of bar 150 to aid in insertion of bar 150, while retaining the locking arrangement necessary to retain bar 150 in tray 100.

Although alternate retention means are disclosed above, the ratchet system utilizing serrated edges 152 and corresponding serrated areas 130 in tray 100 is the preferred embodiment as that system allows for adequate retention of mounting plates having the widest variety of thicknesses.

Figure 18:
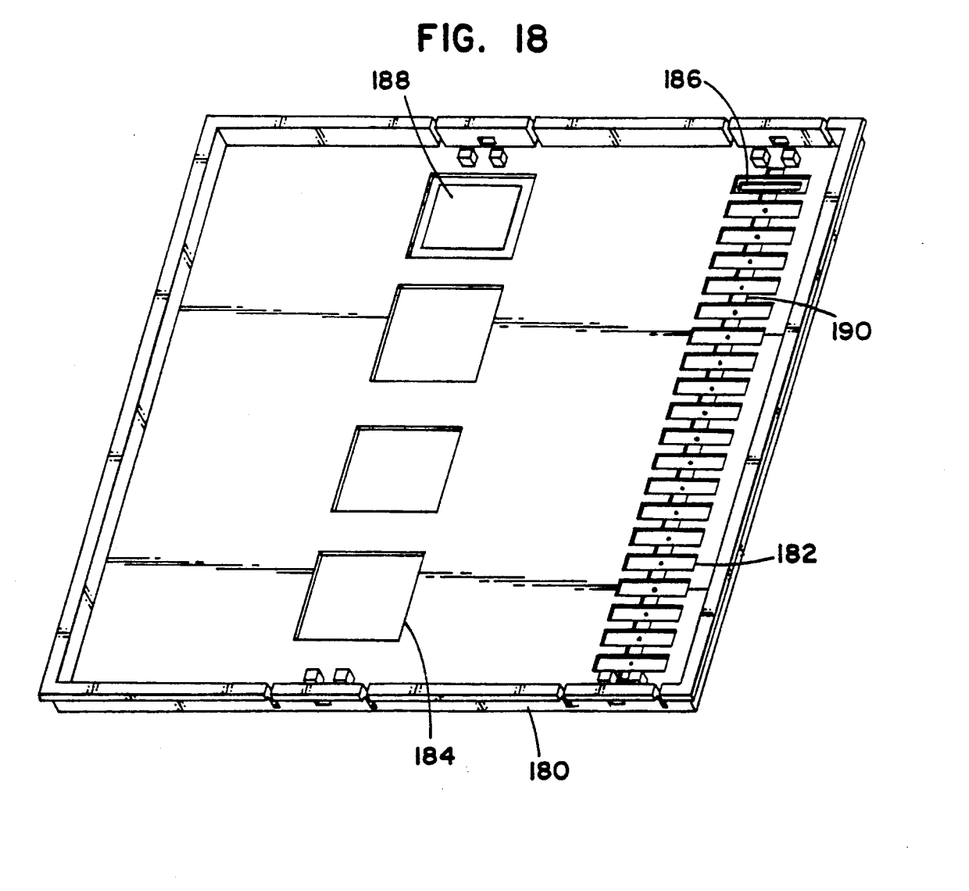
FIG. 18 is a perspective view of an alternate embodiment of the present invention, adapted for use with the bar of FIG. 15.

FIG. 18 depicts an additional alternate tray according to the present invention. Tray 180 includes depressions 182 & 184 adapted for holding a variety of sensitive electronic components. In particular, depressions 182 are sized to retain test boards prior to their attachment to suspension assemblies as described above. Depressions 184 can be sized to hold any suitable type of sensitive electronic components. It will be understood that all of these components are retained in their respective recesses 182 or 184 by the retention bars 150 described above.

Likewise, it will be understood that any of these recesses 182 or 184 can be provided with voids 186 or 188 formed in their bottom surfaces to allow for inspection and/or cleaning of the components without removing them from the tray 180.

Also depicted in FIG. 18 is slot 190 which runs along row of depressions 182. Slot 190 is provided to allow any devices placed in recesses 182 to be picked up by tweezers or similar devices. It will be understood that slot 190 can be adapted for use in any of the tray configurations described above.

Either of trays 100 or 180 can be stacked in a nesting relationship as described with respect to containers 10 and 40 above (see FIG. 2).

It will also be understood that the trays 100 and 180 and retaining bars 150 described above are preferably constructed of the materials described above, although the trays are formed separately from the bars.

It is to be understood, however, that even though numerous characteristics and advantages of the present invention have been set forth in the foregoing description, together with details of the structure and function of the invention, the disclosure is illustrative only, and changes may be made in detail, especially in matters of shape, size and arrangement of parts within the principles of the invention to the full extent indicated by the broad general meaning of the terms in which the appended claims are expressed.

What is claimed is:

1. A combination of at leastone suspension assembly and a container for packaging a plurality of suspension assemblies during transport and handling, said combination comprising:

at least one suspension assembly having a base plate and suspension arm;

a tray having an outer wall and an inside surface which at least partially defines a protected space therien, said inside surface including a bottom surface;

a removable retention bar separate from said tray, said retention bar having two ends; and retention means located on each of said two ends of said removable retention bar and integral with said retention bar, said retention means for retaining said removable retention bar within said tray to capture said base plate of said at least one suspension assembly between said removable retention bar and said bottom surface, whereby said suspension arm of said at least one suspension assembly is suspended in said protected space.

2. A combination according to claim 1, further comprising mounting means formed in said bottom surface for retaining said at least one suspension assembly against said bottom surface while restraining said at least one suspension assembly from lateral movement within said protected space.

3. A combination according to claim 2, wherein said mounting means further comprises a plurality of protrusions formed on said bottom surface.

4. A combination according to claim 2, wherein said mounting means further comprises:

a plurality of recesses formed in said bottom surface, each of said recesses adapted to receive at least one of said base plates of at least one of said suspension assemblies; and a plurality of protrusions formed on said bottom surface proximate each of said plurality of recesses, each of said protrusions cooperating with at least one of said plurality of recesses to restrain at least one of said base plates from lateral motion across said bottom surface.

5. A combination according to claim 1, further comprising inspection means formed in said tray for visual inspection of said suspension arm of said at least one suspension assembly retained in said protected space.

6. A combination according to claim 5, wherein said inspection means further comprises a plurality of voids formed in said tray so as to allow visual inspection of said suspension arm of said at least one suspension assembly.

7. A combination according to claim 1, wherein said tray is fabricated from an electrically conductive material, so that said at least one suspension assembly in said tray may be grounded during transport and handling.

8. A combination according to claim 1, wherein said material is an electrically conductive plastic compound.

9. A combination according to claim 7, wherein said material is metallic.

10. A combination according to claim 1, wherein said tray and retaining means are fabricated from a non-electrically conductive material.

11. A combination according to claim 1, wherein said outer wall includes a bottom wall portion and at least three side wall portions.

12. A combination according to claim 1, wherein said tray is adapted to be stacked with trays similar to said tray.

13. A combination according to claim 1, wherein said retention means further comprises a protrusion on each end of said retention bar, each of said protrusions fitting at least partially within one of said plurality of indentations in said tray.

14. A container for packaging a pluraltiy of suspension assemblies during transport and handling,e ach suspension assembly having a base plate and suspension arm, and each suspension assembly being packaged by capture of its base plate, said container comprising:

a tray having an outer wall with an inside surface which at least partially defines a protected space therein, said inside surface further comprising a bottom surface, said tray further comprising a plurality of serrated portions formed in said inside surface;

a removable elongated retention bar having two ends; and retention means located on each of said two ends of said removable retention bar, said retention means for retaining said removable retention bar within said tray to capture base plates between said removable retention bar and said bottom surface, said retention means further comprising a serrated portion on each end of said retention bar, said serrated portion adapted to cooperate with one of said plurality of serrated portions in said tray, whereby suspension arms of suspension assemblies are suspended in said protected space.

15. The container of claim 14, further comprising mounting means formed in said bottom surface for retaining said at least one suspension assembly against said bottom surface while restraining each suspension assembly from lateral movement within said protected space.

16. The container of claim 15, wherein said mounting means further comprises a plurality of protrusions formed on said bottom surface.

17. The container of claim 15, wherein said mounting means further comprises:

a plurality of recesses formed in said bottom surface, each of said recesses adapted to receive a base plate; and a plurality of protrusions formed on said bottom surface proximate each of said plurality of recesses, each of said protrusions cooperating with at least one of said plurality of recesses to restrain the base plate of a suspension assembly from lateral motion across said bottom surface.

18. The container of claim 14, further comprising inspection means formed in said tray for visual inspection of a suspension assembly retained in said protected space.

19. The container of cliam 18, wherein said inspection means further comprises a plurality of voids formed in said tray.

20. The container of claim 14, wherein said tray is fabricated from an electrically conductive material, so that a suspension assembly in said tray may be grounded during transport and handling.

* * * * *

UNITED STATES PATENT AND TRADEMARK OFFICE
CERTIFICATE OF CORRECTION

PATENT NO. : 5,203,454
DATED : April 20, 1993
INVENTOR(S) : LESLIE G. STRONG

It is certified that error appears in the above-identified patent and that said Letters Patent is hereby corrected as shown below:

In column 1, line 11, after "abandoned" insert --both of--.
In column 11, line 7, for "leastone" read --least one--.
In column 11, line 16, for "therien" read --therein--.
In column 12, line 15, for "pluralty" read --plurality--.
In column 12, line 16, for "e ach" read --each--.
In column 12, line 61, for "cliam" read --claim--.

Signed and Sealed this

Eighteenth Day of January, 1994

Attest:

BRUCE LEHMAN

Attesting Officer        Commissioner of Patents and Trademarks